(12) United States Patent
Taniguchi et al.

(10) Patent No.: US 6,472,746 B2
(45) Date of Patent: Oct. 29, 2002

(54) SEMICONDUCTOR DEVICE HAVING BONDING WIRES SERVING AS EXTERNAL CONNECTION TERMINALS

(75) Inventors: Fumihiko Taniguchi, Kawasaki (JP); Akira Takashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/771,699

(22) Filed: Jan. 30, 2001

(65) Prior Publication Data

US 2002/0017719 A1 Feb. 14, 2002

(30) Foreign Application Priority Data

Aug. 2, 2000 (JP) .................................... 2000-234863

(51) Int. Cl.[7] .............................................. H01L 23/34
(52) U.S. Cl. ..................... 257/723; 257/724; 257/777; 257/778
(58) Field of Search ............................. 257/723, 274, 257/725, 733, 777, 778, 684, 685, 686; 361/744, 749; 174/52.2, 235, 257

(56) References Cited

U.S. PATENT DOCUMENTS

| 5,241,454 A | * | 8/1993 | Ameen et al. | 174/255 |
| 5,604,377 A | * | 2/1997 | Palagonia | 257/685 |
| 5,677,569 A | * | 10/1997 | Choi et al. | 257/686 |
| 5,798,564 A | * | 8/1998 | Eng et al. | 257/686 |
| 6,020,629 A | * | 2/2000 | Farnworth et al. | 174/255 |
| 6,239,496 B1 | * | 5/2001 | Asada | 257/685 |

\* cited by examiner

*Primary Examiner*—David Nelms
*Assistant Examiner*—Dao H. Nguyen
(74) *Attorney, Agent, or Firm*—Armstrong, Westerman & Hattori, LLP (57) ABSTRACT

In a semiconductor element stacking structure, each electrode of each of the stacked semiconductor elements can be drawn out with a simple structure. A plurality of semiconductor elements are arranged in a stacked state, each of the semiconductor elements having a circuit forming surface on which electrodes are formed. A resin layer is formed on the circuit forming surface of each of the semiconductor elements. The resin layer has an outer configuration the same as that of each of the semiconductor elements. A plurality of bonding wires are embedded in the resin layer. One end of the each of the bonding wires is connected to respective one of the electrodes and the other end of each of the bonding wires is exposed on a side surface of the resin layer.

16 Claims, 12 Drawing Sheets

SEMICONDUCTOR DEVICE HAVING BONDING WIRES SERVING AS EXTERNAL CONNECTION TERMINALS

BACKGROUND OF THE INVENTION

1. Field of the Invention

The present invention generally relates to semiconductor devices and, more particularly, to a semiconductor device having external connection terminals on a side surface thereof.

2. Description of the Related Art

In recent years, miniaturization of electronic equipment has progressed, and semiconductor devices used in the electronic equipment has been also miniaturized. As a structure of such a miniaturized semiconductor device, a chip size package (CSP) structure has become popular. In a semiconductor device having the CSP structure, a semiconductor element is fixed on an interposer, and electrodes of the semiconductor element are connected to terminals of the interposer by wire bonding. Protruding electrodes such as solder balls are provided to a lower surface of the interposer as external connection terminals. Accordingly, the package size of the semiconductor device having the CSP structure is much smaller than a conventional lead frame type semiconductor device.

Additionally, a CSP structure, which does not use an interposer, has been suggested. In such a CSP structure, a semiconductor element is not mounted on an interposer, and all wirings and external connection terminals are formed on the semiconductor element. Since such a CSP structure has been achieved, a two-dimensional size of semiconductor devices having the CSP structure has reached their critical limit.

As mentioned above, the two-dimensional miniaturization of the semiconductor devices has reached their limit since they have reached their real chip size. Accordingly, in order to mount the semiconductor elements with further increased density, miniaturization of their mounting area is not needed but miniaturization of their volume is needed. Accordingly, it is desired to develop a stacking structure having a simple structure in which a plurality of semiconductor elements or a plurality of semiconductor devices can be stacked in a three-dimensional state.

When a plurality of semiconductor elements, each of which has a surface on which a plurality of electrodes are formed, are stacked, the surface of each of the semiconductor elements must be covered by an insulating layer so as to stack another semiconductor element thereon. Accordingly, it is an important issue on how to draw out and make a connection with the electrodes of each semiconductor elements.

SUMMARY OF THE INVENTION

It is a general object of the present invention to provide an improved and useful semiconductor device in which the above-mentioned problems are eliminated.

A more specific object of the present invention is to provide a semiconductor element stacking structure in which each electrode of each of stacked semiconductor elements can be drawn out with a simple structure.

In order to achieve the above-mentioned objects, there is provided according to one aspect of the present invention a semiconductor element stacking structure comprising:

- a plurality of semiconductor elements arranged in a stacked state, each of the semiconductor elements having a circuit forming surface on which electrodes are formed;
- a resin layer formed on the circuit forming surface of each of the semiconductor elements, the resin layer having an outer configuration the same as that of each of the semiconductor elements; and
- a plurality of bonding wires embedded in the resin layer, one end of each of the bonding wires being connected to respective one of the electrodes and the other end of each of the bonding wires being exposed on a side surface of the resin layer.

According to the above-mentioned invention, electrical connection with each of the semiconductor elements can be achieved by using the bonding wires exposed on the side surface of the resin layer as external connection electrodes. That is, each of the bonding wires having the exposed end is connected to a corresponding one of the electrodes of each of the semiconductor elements. Accordingly, the external connection electrode can be formed on the exposed end of each of the bonding wires. Thereby, the electrical connection with each of the semiconductor elements can be achieved by the external connection terminal formed on the side surface of the semiconductor element stacking structure even if the semiconductor elements are stacked.

In the semiconductor element stacking structure according to the above-mentioned invention, the exposed ends of the bonding wires may be aligned along a line separated from the circuit forming surface of corresponding one of the semiconductor elements by a predetermined distance.

Accordingly, when the external connection terminals are formed on the exposed ends of the bonding wires, the external connection terminals and the circuit forming surface are prevented from short-circuiting since each of the exposed ends of the bonding wires is separated by a predetermined distance from the circuit forming surface of the corresponding semiconductor element.

The exposed ends of the bonding wires may be aligned along a plurality of lines separated from the circuit forming surface of corresponding one of the semiconductor elements by different distances, respectively. Accordingly, even if the pitch of the electrodes of the semiconductor element is small and a distance between the adjacent bonding wires in a vertical direction is small, the distance of the adjacent bonding wires can be increased by a distance in a vertical direction. More specifically, the exposed ends of the bonding wires may be aligned along a first line and a second line, the first line being separated from the circuit forming surface of the corresponding one of the semiconductor elements by a first predetermined distance, the second line being separated from the circuit forming surface of the corresponding one of the semiconductor elements by a second predetermined distance, the exposed ends of the bonding wires being alternately arranged so that one of the exposed ends is positioned on the first line and another exposed ends adjacent to the one of the exposed ends is positioned the second line.

Additionally, a protruding electrode may be provided on each of the exposed ends of the bonding wires. For example, the protruding electrodes can be easily formed by stud bumps. Additionally, the corresponding electrodes of the semiconductor elements can be connected by connecting the protruding electrodes aligned in a stacking direction by bonding wires.

Additionally, protruding electrodes may be provided on a surface of a resin layer covering the circuit forming surface of a lowermost semiconductor element from among the stacked semiconductor elements, the protruding electrodes being connected to electrodes of the semiconductor elements. Accordingly, in a case in which the stacked semiconductor elements are the same kind and the electrode arrangement is the same, the protruding electrodes formed on the side surface of the semiconductor element stacking structure can be used as electrode for connecting the corresponding electrodes of the semiconductor elements, and the protruding electrodes provided on the surface of the resin layer covering the circuit forming surface of the lowermost semiconductor elements can be used as external connection terminals.

Additionally, a wiring board may be mounted on a side surface on which the protruding electrodes provided to the exposed ends are formed so that the protruding electrodes are connected to each other by wirings of the wiring board. Accordingly, the corresponding electrodes of the semiconductor elements can be connected to each other by easily connecting the protruding electrodes by the wiring board.

Additionally, another semiconductor element may be mounted on a side surface on which the protruding electrodes provided to the exposed ends are formed. That is, another semiconductor element can be easily mounted by using the protruding electrodes provided on the exposed ends of the bonding wires. Thus, the number of semiconductor elements can be increased. Additionally, a different kind of semiconductor element can be added to the semiconductor element stacking structure.

Additionally, there is provided according to another aspect of the present invention a semiconductor device having a plurality of stacked semiconductor elements, comprising:

a semiconductor element stacking structure comprising:
    a plurality of semiconductor elements arranged in a stacked state, each of the semiconductor elements having a circuit forming surface on which electrodes are formed;
    a resin layer formed on the circuit forming surface of each of the semiconductor elements, the resin layer having an outer configuration the same as that of each of the semiconductor elements;
    a plurality of bonding wires embedded in the resin layer, one end of the each of the bonding wires being connected to respective one of the electrodes and the other end of each of the bonding wires being exposed on a side surface of the resin layer; and
    a plurality of protruding electrodes provided on the respective exposed ends of the bonding wires;
a wiring board provided over a bottom surface and side surfaces of the semiconductor element stacking structure;
protruding terminals connected to the respective protruding electrodes provided on the semiconductor element stacking structure through the wiring board, the protruding terminals being provided on a side of the wiring board opposite to, the semiconductor element stacking structure.

According to the above-mentioned invention, since the electrodes of the semiconductor elements are connected to each other by the wiring board and the external connection terminals such as solder balls are formed on the wiring board, the surface mountable semiconductor device can be easily formed.

In the above-mentioned invention, the wiring board may comprise a bottom part covering a bottom surface of the semiconductor element stacking structure and a side part covering a side surface on which the protruding electrodes are formed, and the protruding terminals are provided on the bottom part of the wiring board. Additionally, the wiring board may comprise a bottom part covering a bottom surface of the semiconductor element stacking structure and a side part covering a side surface on which the protruding electrodes are formed, and the protruding terminals are provided on the side part of the wiring board.

Additionally, there is provided according to another aspect of the present invention a semiconductor device having a plurality of stacked semiconductor elements, comprising:

a semiconductor element stacking structure comprising:
    a plurality of semiconductor elements arranged in a stacked state, each of the semiconductor elements having a circuit forming surface on which electrodes are formed;
    a resin layer formed on the circuit forming surface of each of the semiconductor elements, the resin layer having an outer configuration the same as that of each of the semiconductor elements;
    a plurality of bonding wires embedded in the resin layer, one end of the each of the bonding wires being connected to respective one of the electrodes and the other end of each of the bonding wires being exposed on a side surface of the resin layer; and
    a plurality of protruding electrodes provided on the respective exposed ends of the bonding wires,
    wherein protruding electrodes are provided on a surface of a resin layer covering the circuit forming surface of a lowermost semiconductor element from among the stacked semiconductor elements, the protruding electrodes being connected to electrodes of the semiconductor elements; and the protruding electrodes aligned along a line extending in a stacking direction from among the protruding electrodes provided on the exposed ends of the bonding wires are connected by bonding wires to each other;
a wiring board provided opposite to a surface of a resin layer covering the circuit forming surface of a lowermost semiconductor element;
a seal resin encapsulating the semiconductor element stacking structure on the wiring board; and
protruding terminals connected to the respective protruding electrodes provided on the surface of the resin layer covering the circuit forming surface of the lowermost semiconductor element in the semiconductor element stacking structure.

According to the above-mentioned invention, the electrodes of the semiconductor elements are connected to the protruding electrodes provided on the surface of the resin layer covering the circuit forming surface of the lowermost semiconductor element. Thus, by treating the semiconductor element stacking structure as a single semiconductor element, a semiconductor device having a plurality of semiconductor elements can be easily formed. That is, the semiconductor element stacking structure is mounted on one side of the wiring board and encapsulated by the seal resin, and the protruding terminals such as solder balls can be formed on the opposite side of the wiring board. Thereby, a semiconductor device having a plurality of stacked semiconductor elements can be easily formed.

Additionally, there is provided according to another aspect of the present invention a manufacturing method of a semiconductor element stacking structure, comprising the steps of:

preparing a plurality of semiconductor substrates each of which having a plurality of semiconductor elements;
connecting by bonding wires corresponding electrodes of adjacent semiconductor elements to each other so that the bonding wires extend over boundaries between the adjacent semiconductor elements;

forming a resin layer on a circuit forming surface of each of the semiconductor substrates so as to embed the bonding wires in the resin layer, and stacking the semiconductor substrates so as to integrate the semiconductor substrates with each other; and cutting the semiconductor substrates and the resin layers together along the boundaries of the semiconductor elements.

According to the above-mentioned invention, each of the bonding wires is formed in an arch-like shape which extends over the boundary between the adjacent semiconductor elements. Accordingly, each of the bonding wires is cut in the middle thereof when the wafer is cut to individualize the semiconductor elements, and a cut end of each of the bonding wires is exposed on the side surface of the resin layer. Since the end opposite to the cut end of each of the bonding wires is connected to the corresponding one of the electrodes of the corresponding semiconductor elements, an external connection terminal can be formed on the cut end of each of the bonding wires. Thereby, electrical connection with each of the semiconductor elements can be achieved by the external connection terminals formed on the side surface even if the semiconductor elements are stacked.

Additionally, the step of connecting may include the step of connecting the bonding wires so that a part of each of the bonding wires above the boundaries is parallel to the circuit forming surface of each of the semiconductor substrates over a predetermined range. Accordingly, each of the bonding wires in the vicinity of a part to be cut can be separated from the circuit forming surface of the corresponding semiconductor element by a constant distance. Thus, the cut end of each of the bonding wires can be maintained at a constant distance from the circuit forming surface even if the cutting line is slightly offset.

Other objects, features and advantages of the present invention will become more apparent from the following descriptions when read in conjunction with the accompanying drawings.

DETAILED DESCRIPTION OF THE PREFERRED EMBODIMENTS

The present invention is suitable for a case in which a large capacity memory is formed by stacking the same kind of semiconductor elements such as memory ICs including DRAMs or flash memories. That is, the present invention is particularly effective when a plurality of semiconductor elements, each of which has the same electrode structure and the same shape, are stacked each other.

Figure 1:
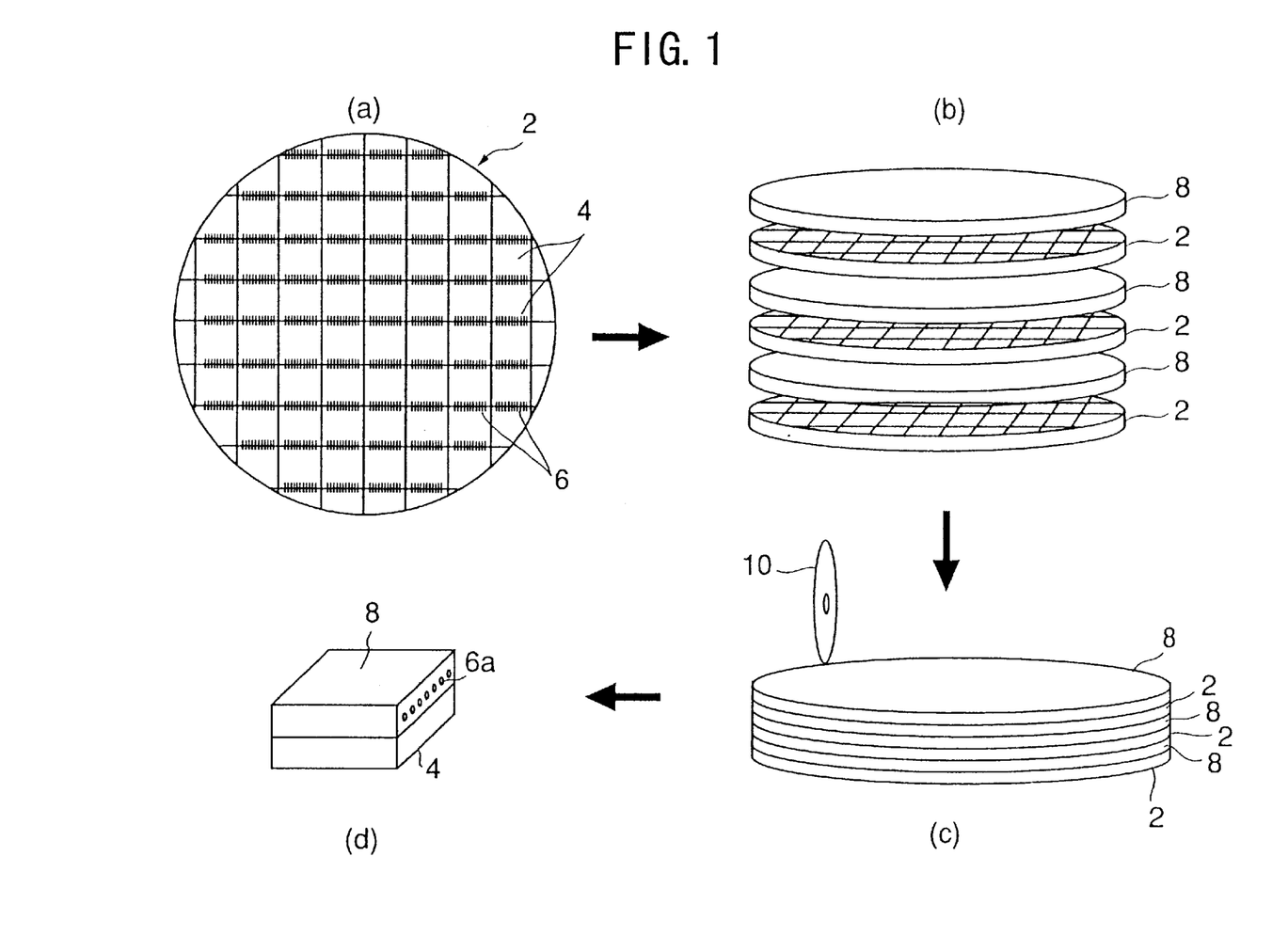
FIG. 1 is an illustration for explaining a principle of the present invention.

FIG. 1 is an illustration for explaining a principal of the present invention. First, as shown in FIG. 1-(a), electrodes of adjacent semiconductor elements 4 formed on a wafer 2 are connected to each other by bonding wires 6. Each of the semiconductor elements 4 has a generally square shape and the same electrode arrangement. In this case, the electrodes are provided along opposite ends of the square shape at the same pitch. The electrodes of the adjacent semiconductor elements are arranged so as to opposite to each other.

In the wafer 2 having the above-mentioned structure, the opposing electrodes are connected to each other by the bonding wires (metal wires) 6 so that the bonding wires extend over the boundaries of the semiconductor elements 4. Then, as shown in FIG. 1-(b), an insulating material such as a liquid resin or a sheet-like resin is applied to a surface on which the bonding wires 6 are provided so as to form a resin layer 8. The height of the insulating material is equal to or greater than the height of the bonding wires 6 so that the bonding wires 6 are embedded into the resin layer 8. Then, another wafer 2 provided with the bonding wires 6 is stacked on the resin layer 8.

In the example shown in FIG. 1, three wafers 2 are stacked via resin layers 8. The stacked wafers 2 are cut, as shown in FIG. 1-(c), by a dicing saw 10 along dicing lines (that is, boundary lines of the semiconductor elements 4). In this case, each of the cut pieces forms a semiconductor element stacking structure in which three semiconductor elements 4 are stacked. FIG. 1-(d) shows one of the semiconductor elements 4 in one of the semiconductor element stacking structures and the resin layer 8 formed thereon. Since the bonding wires 6 extend over the dicing line, the bonding wires 6, after the wafers 2 are cut, are cut in the middle thereof. As a result, a cut end (exposed end) 6a of each of the bonding wires 6 is exposed on a side surface of the resin layer 8 which surface corresponds to a cutting surface (side surface) of the semiconductor element stacking structure.

Figure 2:
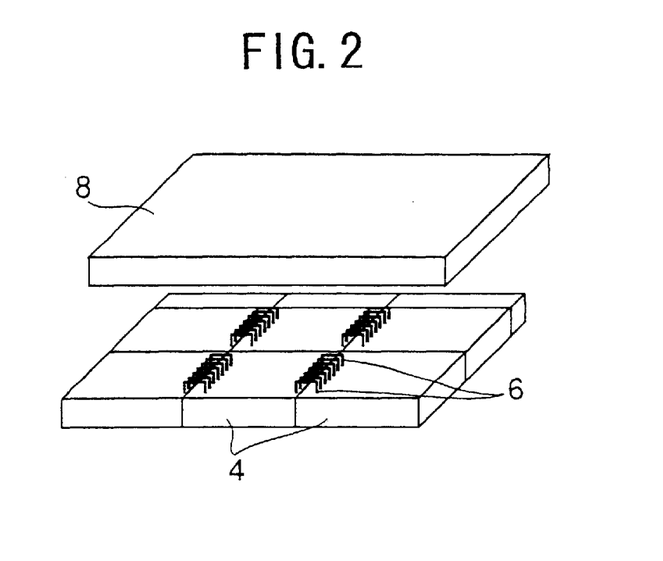
FIG. 2 is a perspective view of a part of a wafer in which bonding wires are provided.

FIG. 2 is a perspective view of a part of the wafer 2 provided with the bonding wires 6. As shown in FIG. 2, an end of each of the bonding wires 6 is connected to an electrode provided on one of adjacent semiconductor elements 4, and the other end is connected to a corresponding electrode of the other of the adjacent semiconductor elements 4. The opposite end portions of each of the bonding wires 6 are raised substantially perpendicular to the surface of the wafer 2. Additionally, the center portion (horizontal portion) of each of the bonding wires 6 is formed so as to be parallel to the surface of the wafer 2.

As mentioned above, by providing the horizontal portion to each of the bonding wires 6, a height of the cut end 6a of each of the bonding wires 6 from the surface of the semiconductor element 4 does not vary when a position of the dicing saw 10 is offset toward one of the semiconductor elements 4 during a cutting operation of the wafers 2.

Figure 3:
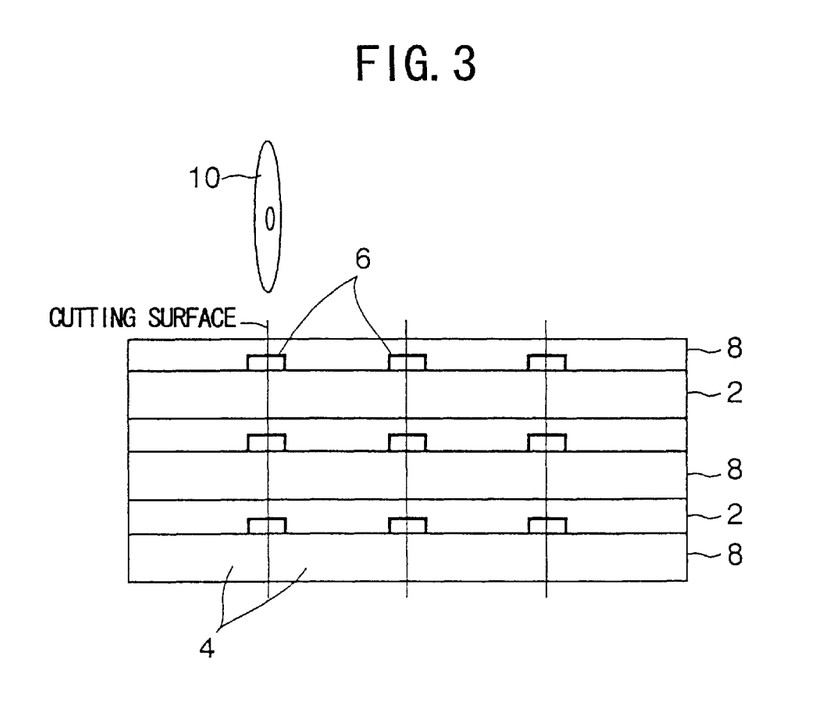
FIG. 3 is a cross-sectional view of a part of a stacked wafers.

FIG. 3 is a cross-sectional view of a part of the stacked wafer 2. As shown in FIG. 3, the position (cutting line) of the dicing saw 10 corresponds to the horizontal portion of each of the bonding wires 6. Accordingly, if a length of the horizontal portion of each of the bonding wires 6 is larger than an allowable range of the position of the dicing saw 10, the cut end 6a of each of the bonding wires 6 in the semiconductor element stacking structure is maintained at the same height even when the cutting position of the dicing saw 10 is offset. The cut end 6a of each of the bonding wires 6 in the semiconductor element stacking structure serves as an external connection terminal. Thus, it is important to accurately position the cut end 6a in a direction of height.

Figure 4:
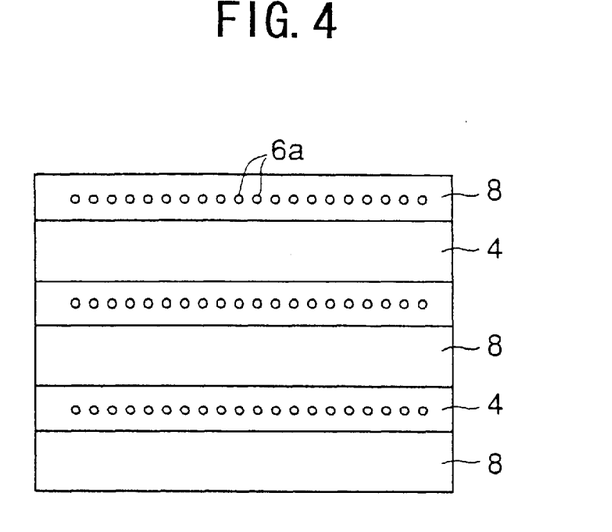
FIG. 4 is a side view of a semiconductor element stacking structure according to a first embodiment of the present invention.

A description will now be given, with reference to FIGS. 4 and 5, of a semiconductor element stacking structure according to a first embodiment of the present invention. FIG. 4 is an illustration showing a cutting surface of one of the semiconductor element stacking structures, which are individualized by cutting the wafer stacking structure shown in FIG. 3. As shown in FIG. 4, the cut ends 6a of the bonding wires are exposed and arranged in the cutting surface of the resin layer 8 between the semiconductor elements. Since each of the bonding wires 6 is connected to an electrode of the semiconductor element 4 by being passed through the resin layer 8, the cut end 6a of each of the bonding wires 6 can serve as an external connection terminal.

Figure 5:
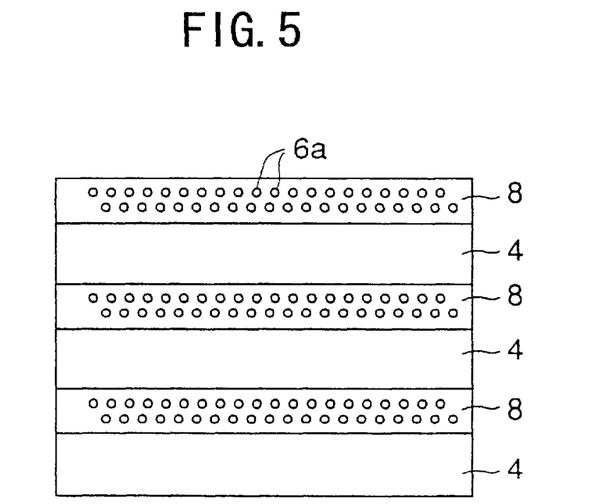
FIG. 5 is a side view of a semiconductor element stacking structure in which a height of horizontal portions of bonding wires is varied.

FIG. 5 shows a side surface of a semiconductor element stacking structure in which the height of the horizontal portions of the bonding wires 6 is varied. In the example shown in FIG. 5, the pitch of the electrodes of each semiconductor element 4 is reduced to a half of the pitch in the example shown in FIG. 4. Accordingly, if the bonding wires 6 are provided at the same height as shown in FIG. 4, the bonding wires may contact to each other. Accordingly in the variation shown in FIG. 5, a distance between adjacent bonding wires 6 is increased by alternately varying the height of the horizontal portions of the bonding wires. Thereby, the cut ends 6a of the bonding wires 6 are alternately positioned in two rows, that is, positioned in a staggered arrangement.

A description will now be given, with reference to FIGS. 6 and 7, of semiconductor devices using the above-mentioned semiconductor element stacking structures.

Figure 6:
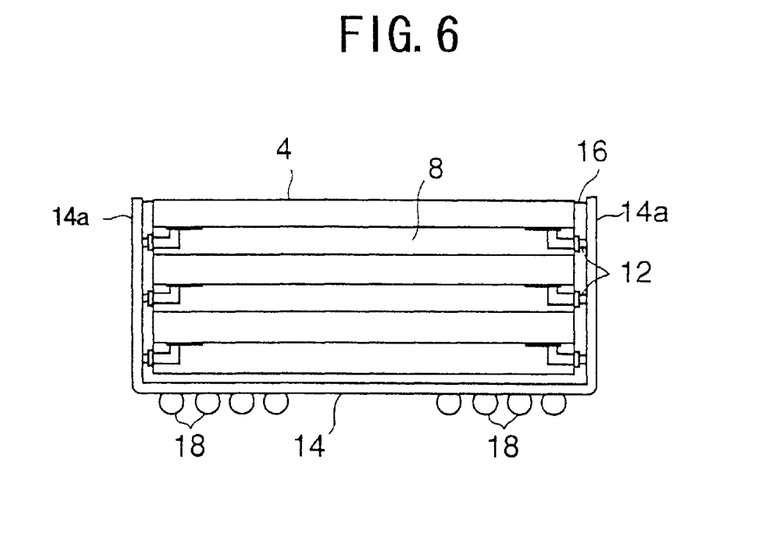
FIG. 6 is a cross-sectional view of a semiconductor device, which is formed by using the semiconductor element stacking structure shown in FIG. 4.

FIG. 6 is a cross-sectional view of a semiconductor device, which is formed by using the above-mentioned semiconductor element stacking structures. The above-mentioned semiconductor element stacking structures have ends 6a of the bonding wires 6 exposed on the side surface thereof. A gold (Au) stud bump 12 is formed on each of the ends 6a. Then, an interposer 14 is formed by a flexible and bendable substrate. As for the material of the interposer 14, a polyimide tape or a flexible printed board may be used. A protruding electrode may be formed by a plating method instead of the above-mentioned stud bump 12.

The interposer 14 is formed by bending side portions 14a thereof so that the interposer 14 fits the side surfaces of the semiconductor element stacking structure. Then, the stud bumps 12 formed on the side surfaces of the semiconductor element stacking structure is bonded to the terminal formed on the side portions of the interposer 14 by flip-chip bonding. An anisotropic conductive adhesive may be used for bonding the stud bumps 12. Additionally, the interposer 14 may be glued to the semiconductor element stacking structure by applying an NCF or an under fill material 16 between the interposer 14 and the semiconductor element stacking structure.

Solder balls (protruding electrodes) 18 as external connection terminals of the semiconductor device are formed on an outer side of an outer bottom surface of the interposer 14. That is, the electrodes of each semiconductor element 4 of the semiconductor element stacking structure and the solder balls 18 are connected to each other by wirings of the interposer 14. As mentioned above, the semiconductor device shown in FIG. 6 serves as a multi-chip package semiconductor device.

Figure 7:
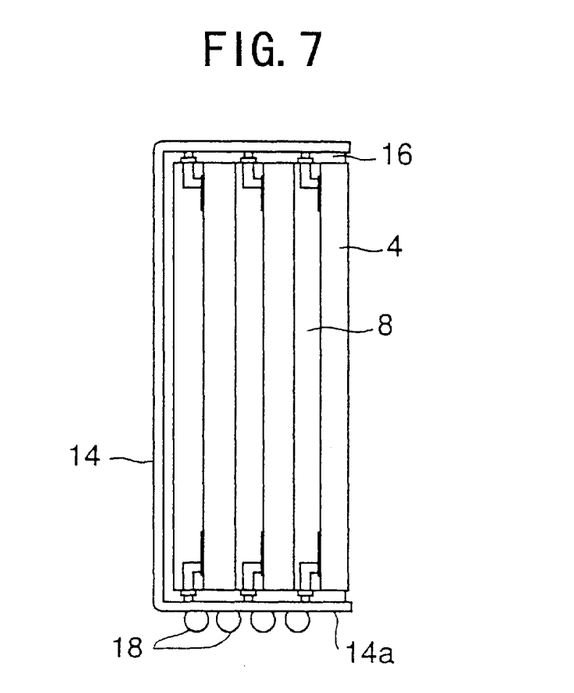
FIG. 7 is a cross-sectional view of a semiconductor device according to a variation of the semiconductor device shown in FIG. 6.

FIG. 7 is a cross-sectional view of a semiconductor device according to a variation of the semiconductor device shown in FIG. 6. The semiconductor device shown in FIG. 7 has the same structure as the semiconductor device shown in FIG. 6 except for the positions of the solder balls 18. That is, as shown in FIG. 7, the solder balls 18 are provided on the outer side of one of the side portions 14a of the interposer 14. According to such a structure, each semiconductor element 4 is positioned perpendicular to the mounting surface of the semiconductor device. A mounting area of the semiconductor device shown in FIG. 7 is smaller than that of the semiconductor device shown in FIG. 6.

Figure 8:
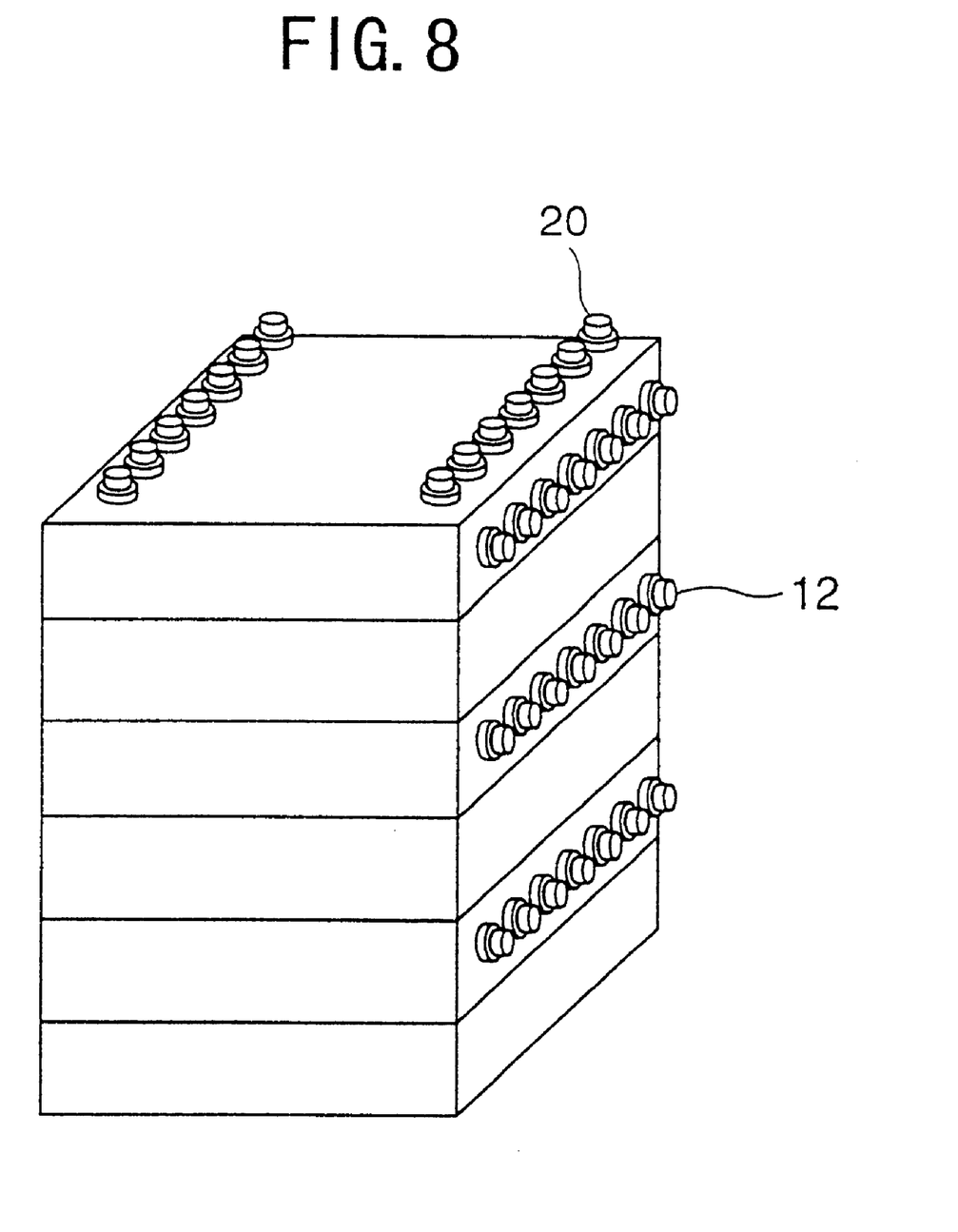
FIG. 8 is a perspective view of a semiconductor element stacking structure according to a second embodiment of the present invention.

A description will now be given of a semiconductor element stacking structure according to a second embodiment of the present invention. FIG. 8 is a perspective view of the semiconductor element stacking structure according to the second embodiment of the present invention. In the above-mentioned semiconductor element stacking structure according to the first embodiment, the cut ends 6a of the bonding wires 6 serving as external connection terminals are exposed on the side surface, and the stud bumps 12 are formed on the cut ends 6a. On the other hand, the semiconductor element stacking structure according to the second embodiment has stud bumps 12 formed on the cut ends 6a of the bonding wires 6 exposed on the side surface similar to the semiconductor element stacking structure according to the first embodiment, and external connection terminals 20 are also formed on a surface 8a of the resin layer 8 provided on the circuit forming surface of the lowermost semiconductor element 4. It should be noted that, in FIG. 8, the semiconductor element stacking structure is shown in an upside down state, that is, the lowermost resin layer 8 is shown as an uppermost part. As for the external connection terminals 20, a structure the same as the structure of the Au stud bumps 12 provided on the side surface may be used. Additionally, protruding electrodes may be formed by a plating method instead of the Au stud bumps.

Figure 9A:
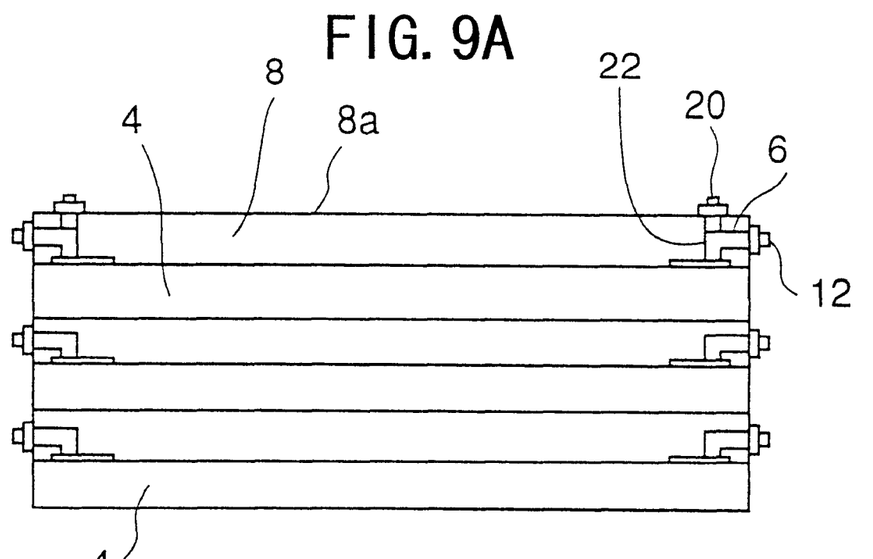
FIG. 9A is a cross-sectional view of the semiconductor element stacking structure shown in FIG. 8.

FIG. 9A is a cross-sectional view of the semiconductor element stacking structure shown in FIG. 8. As shown in FIG. 9A, bonding wires 6 are connected to the electrodes 4a of the lowermost semiconductor element 4, and electrode connection parts 22 extending toward the surface 8a of the resin layer 8 are provided. The electrode connection parts 22 may be formed by via holes or the like, and external connection terminals such as stud bumps are formed at the surface 8a of the resin layer 8.

Figure 9B:
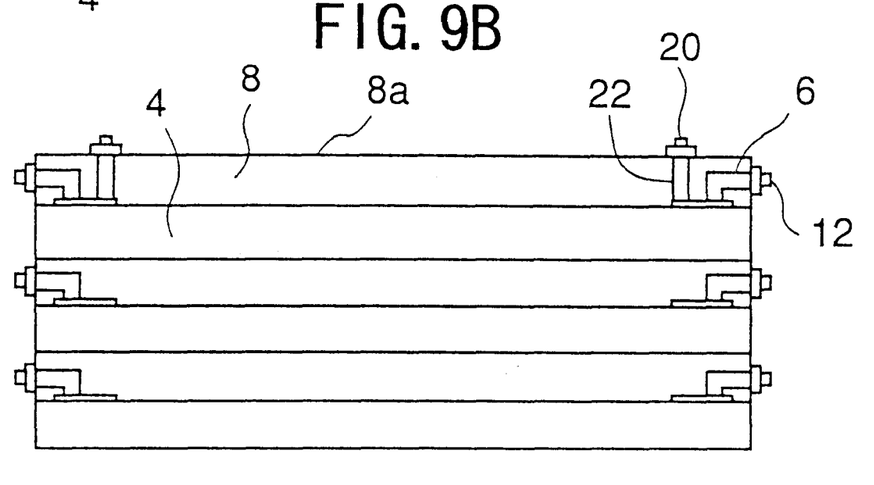
FIG. 9B is a cross-sectional view of a variation of the semiconductor element stacking structure shown in FIG. 9A.

FIG. 9B is a cross-sectional view of a variation of the semiconductor element stacking structure shown in FIG. 9A. In the semiconductor element stacking structure shown in FIG. 9B, the electrode connection parts are provided at inner positions of the connecting portions of the bonding wires 6. When the pitch of the bonding wires 6 is small, a distance between the bonding wires and the corresponding electrode connection parts 22 can be increased by providing the electrode connection parts at the inner positions.

Figure 10:
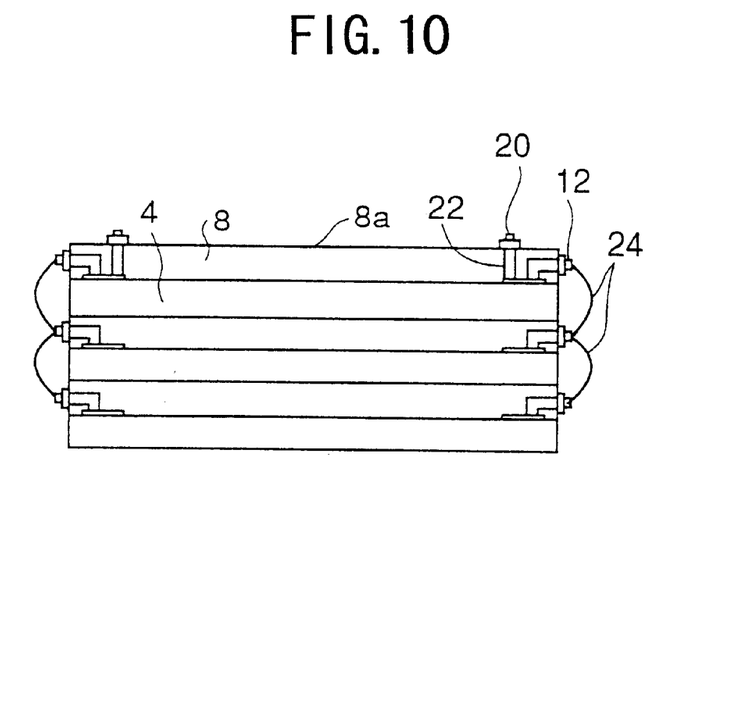
FIG. 10 is a cross-sectional view of an example in which stud bumps formed on a side surface of the semiconductor element stacking structure are connected by bonding wires.

FIG. 10 is a cross-sectional view of an example in which the stud bumps 12 formed on the side surface of the semiconductor element stacking structure are connected by bonding wires 24. The stacked semiconductor elements 4 are the same kind, and the same signal is supplied to the stud bumps 12 aligning in a vertical direction. Accordingly, by connecting the stud bumps 12 aligning in a vertical direction to each other by the bonding wires 24, a common signal can be supplied to each of the semiconductor elements 4 through the external connection terminals 20 formed on the surface 8a of the resin layer 8 and the bonding wires 24.

The semiconductor element stacking structure shown in FIG. 10 has the external connection terminals 20, and serves as a semiconductor device alone when the external connection terminals are connected to a mounting board. However, the semiconductor element stacking structure shown in FIG. 10 has the stud bumps 12 and the bonding wires 24 that are exposed outside.

Figure 11:
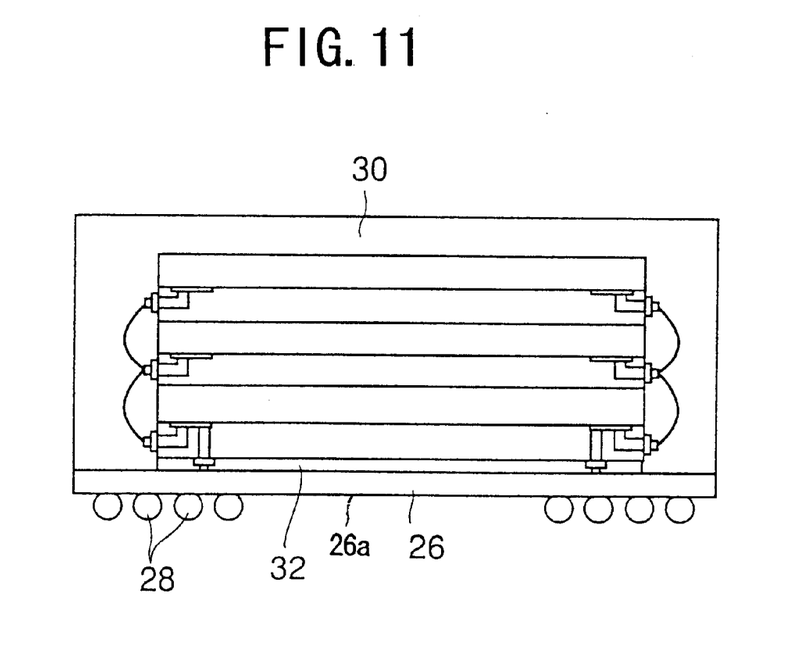
FIG. 11 is a cross-sectional view of a multi-chip package semiconductor device provided with protruding electrodes via an interposer.

FIG. 11 is a cross-sectional view of a multi-chip package semiconductor device provided with protruding electrodes via an interposer. In FIG. 11, the semiconductor element stacking structure shown in FIG. 10 is positioned so that the external connection terminals 20 are opposite to an interposer 26.

The bottom surface 26a of the interposer 26 is provided with solder balls 28, and each of the solder balls 28 is connected to the respective one of the external connection terminals 20 of the semiconductor element stacking structure by wirings formed in the interposer 26. Side surfaces and an upper surface of the semiconductor element stacking structure are covered by seal resin 30 so as to protect the stud bumps 12 and the bonding wires 24.

Additionally, an under fill material 32 is applied between the semiconductor element stacking structure and the interposer 26 so as to reinforce the bonded part of the semiconductor element stacking structure to the interposer 26.

A description will now be given of variations of the semiconductor element stacking structure according to the second embodiment of the present invention.

Figure 12:
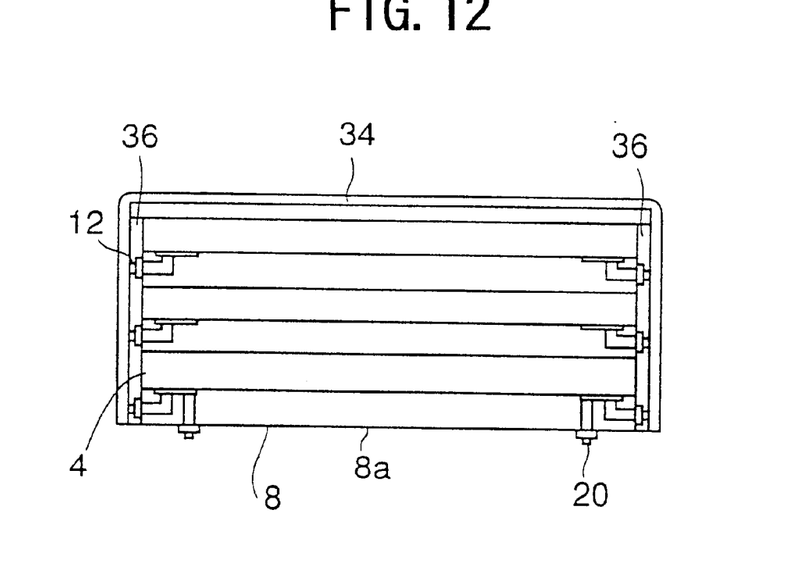
FIG. 12 is a cross-sectional view of a semiconductor element stacking structure according to a first variation of the second embodiment.

FIG. 12 is a cross-sectional view of a semiconductor element stacking structure according to a first variation of the second embodiment. In the first variation shown in FIG. 12, the side surfaces and the upper surface of the semiconductor element stacking structure are covered by an interposer 34.

That is, the stud bumps 12 provided on the side surfaces of the semiconductor element stacking structure are connected by wirings formed in the interposer 34 instead of the bonding wires 24 shown in FIG. 10. Additionally, an under fill material 36 is applied between the side portions of the interposer 34 and the semiconductor element stacking structure. The semiconductor element stacking structure has the external connection terminals 20 on the surface 8a thereof so that the semiconductor element stacking structure alone can serve as a semiconductor device.

Figure 13:
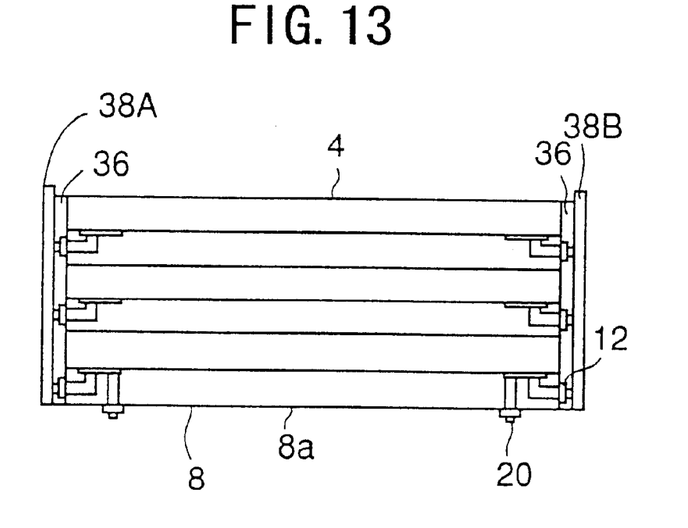
FIG. 13 is a cross-sectional view of a semiconductor element stacking structure according to a second variation of the second embodiment.

FIG. 13 is a cross-sectional view of a semiconductor element stacking structure according to a second variation of the second embodiment. The second variation shown in FIG. 13 has the same basic structure as the first variation shown in FIG. 12. However, the second variation is provided with an interposer on only the side surfaces of the semiconductor element stacking structure while the first variation has the interposer 34, which is bent so as to cover the upper surface and the side surfaces of the semiconductor element stacking structure.

That is, an interposer 38A is positioned opposite to one of the side surfaces on which the stud bumps 12 are provided, and an interposer 38B is positioned opposite to the other of the side surfaces on which the stud bumps 12 are provided. The under fill material 36 is applied between each of the interposers 38A and 38B and the corresponding side surface of the semiconductor element stacking structure. Since the external connection terminals are formed on the surface 8a of the semiconductor element stacking structure, the semiconductor element stacking structure alone can serve as a semiconductor device.

Figure 14:
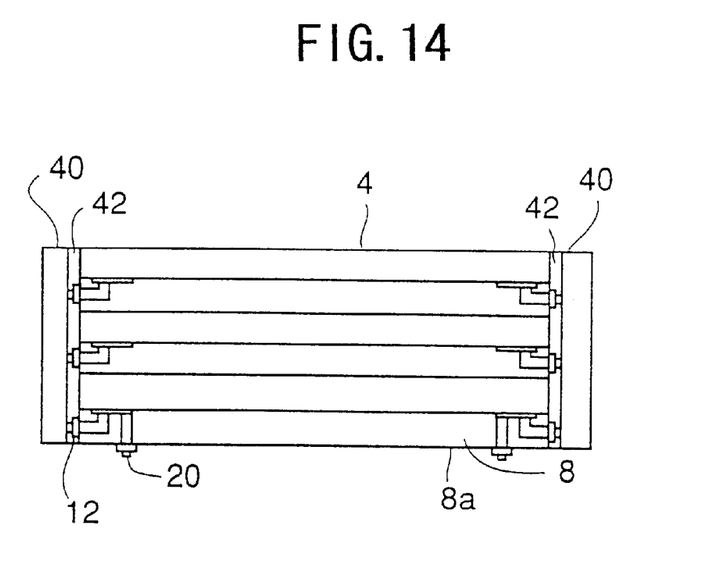
FIG. 14 is a cross-sectional view of a semiconductor element stacking structure according to a third embodiment of the present invention.

A description will now be given, with reference to FIGS. 14 and 15, of a semiconductor element stacking structure according to a third embodiment of the present invention. FIG. 14 is a cross-sectional view of the semiconductor element stacking structure according to the third embodiment of the present invention. In the semiconductor element stacking structure shown in FIG. 14, a different semiconductor element is mounted by using the stud bumps 12 of the semiconductor element stacking structure shown in FIG. 10 instead of connecting the stud bumps 12 to each other by bonding wires 24.

Figure 15:
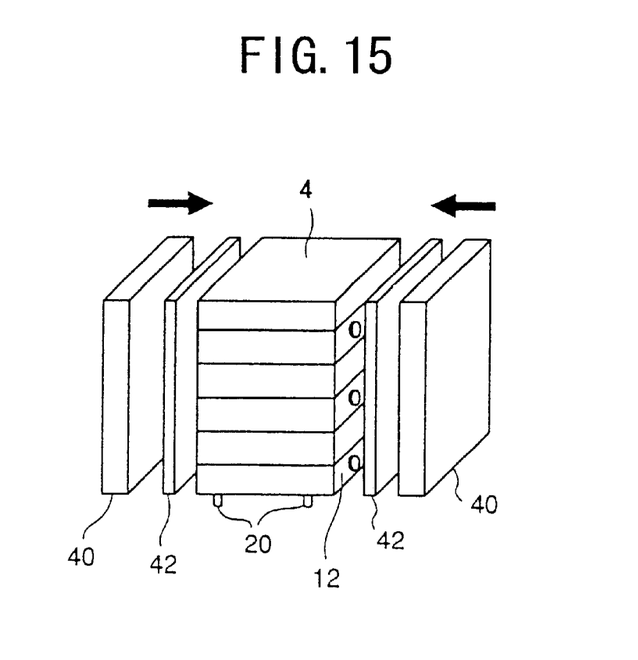
FIG. 15 is an exploded perspective view of the semiconductor element stacking structure shown in FIG. 14.

That is, as shown in FIG. 15, a semiconductor element 40 is bonded to the side surface, on which the stud bumps 12 are provided, via an under fill material 42. In this structure, the different kind of semiconductor element 40 can be combined and integrated with the semiconductor element stacking structure in which a plurality of the same kind of semiconductor elements 4 are provided. Since the external connection terminals are formed on the surface 8a of the semiconductor element stacking structure, the semiconductor element stacking structure shown in FIG. 14 alone can serve as a semiconductor device.

Figure 16:
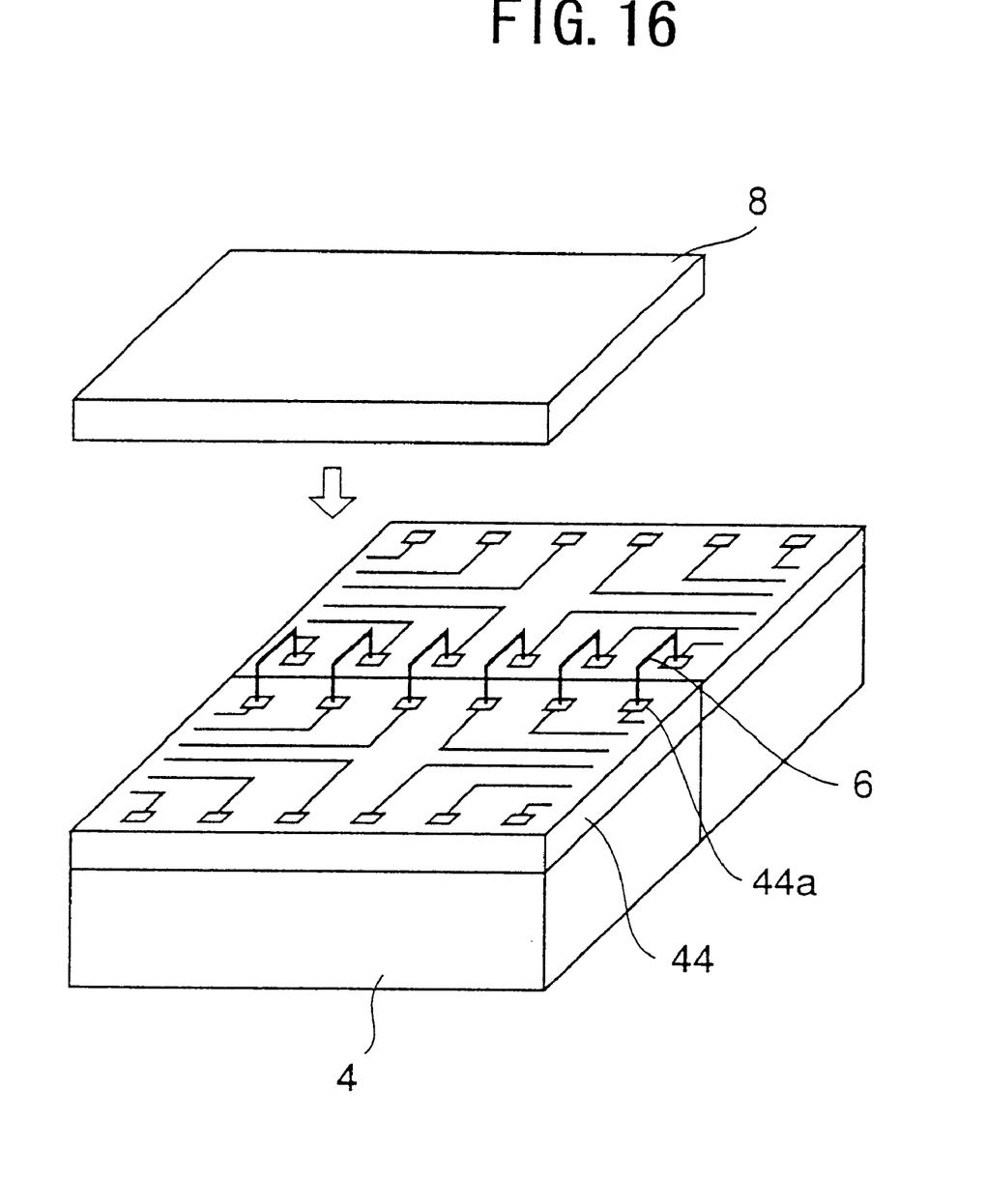
FIG. 16 is a perspective view of an interposer and a semiconductor element having a rectangular shape.

The semiconductor elements 4 stacked in the semiconductor element stacking structure and the semiconductor element 40 are formed in a generally square shape, and the electrodes are arranged along opposite two sides thereof. However, if the semiconductor elements 4 and the semiconductor element 40 are generally a rectangular shape and electrodes are formed on the opposite two shorter sides thereof, the electrodes can be arranged along two opposite longer sides of the rectangular shape by providing an interposer on the surface of each semiconductor element 4. Accordingly, if the bonding wires 6 are connected by utilizing electrodes 44a on the interposer 44 as shown in FIG. 16, the pitch of the bonding wires 6 can be increased. Additionally, if the positions of the electrodes of each semiconductor element 4 are fixed, the positions of the connection parts of the bonding wires 6 can be freely changed by the interposer 44.

When the same kind of semiconductor elements such as memory chips are stacked as in the above-mentioned embodiments, the electrodes of each of the semiconductor elements may be connected to each other since the same signal is supplied thereto. However, there are electrodes to which individual signals must be supplied such as chip select signals. The following method can achieve connection of the electrodes to the external connection terminals.

Figure 17:
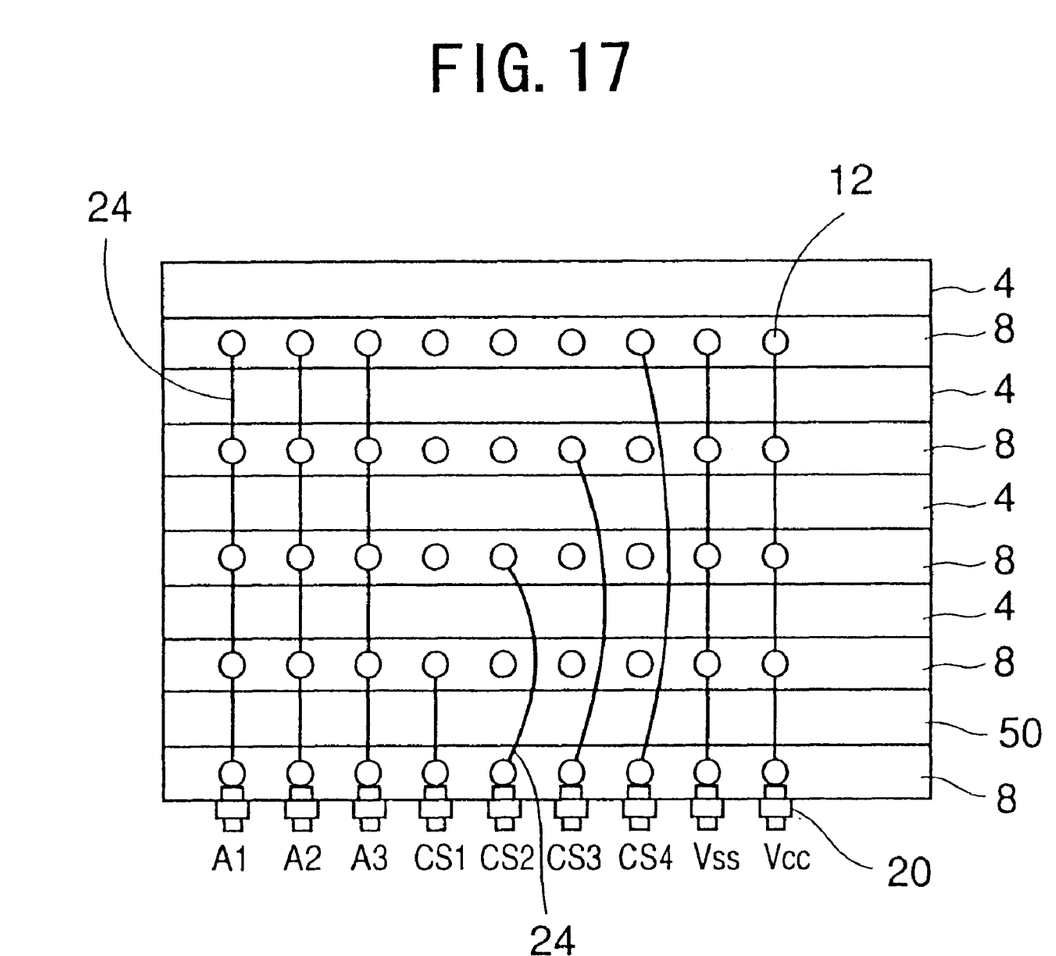
FIG. 17 is an illustration of a semiconductor element stacking structure in which a dummy chip is provided on the lowermost position.

FIG. 17 is an illustration of a semiconductor element stacking structure in which a dummy chip is provided on the lowermost position so as to provide individual chip select signal electrodes for each semiconductor element. In the semiconductor element stacking structure shown in FIG. 17, for semiconductor elements 4 are stacked, and a dummy chip 50 is provided under the semiconductor elements 4. The dummy chip 50 has the same electrode structure as each semiconductor element 4, but does not function as a semiconductor element. That is, the dummy chip 50 is provided for merely connecting the electrodes.

In the example shown in FIG. 17, electrodes A1, A2, A3, Vss and Vcc of each of the semiconductor elements 4 can be commonly connected. Accordingly, the electrodes A1, A2, A3, Vss and Vcc are connected to each other by the bonding wires 24 provided on the side surface, and finally connected to the corresponding one of the external connection terminals 20 provided on the bottom surface (the surface 8a of the resin layer 8) of the semiconductor element stacking structure. On the other hand, different chip select signals must be supplied to chip select electrodes CS1, CS2, CS3 and CS4 of each of the semiconductor elements 4, respectively. Accordingly, each of the chip select electrodes CS1, CS2, CS3 and CS4 of each of the semiconductor elements 4 is connected to the respective one of the external connection terminals 20.

That is, in FIG. 17, the bonding wires 24 corresponding to the chip select electrodes CS1, CS2, CS3 and CS4 are connected to respective one of electrodes of the dummy chip 50. Accordingly, the chip select signals can be supplied individually to each of the semiconductor elements via the external connection terminals 20.

Additionally, when the interposer is provided on the side surface of the semiconductor element stacking structure as shown in FIG. 7, the chip select electrode of each of the semiconductor elements can be individually connected to the corresponding one of the external connection electrodes 20 (solder balls 18).

Figure 18:
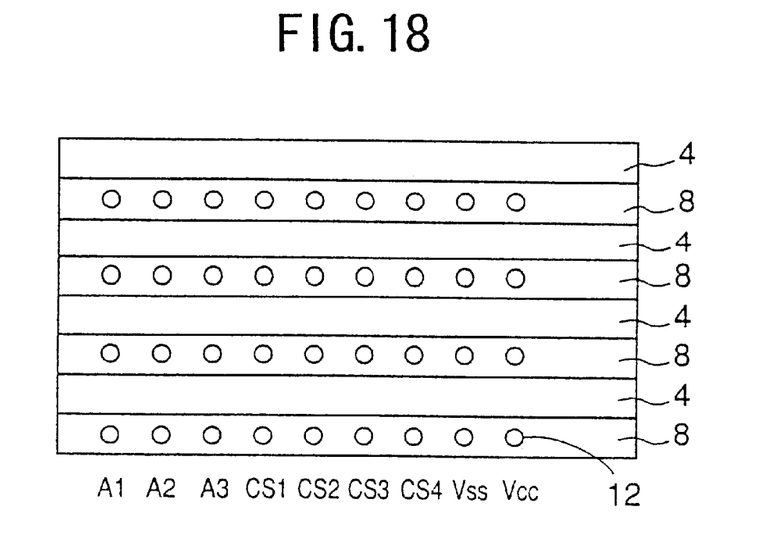
FIG. 18 is a side view of the semiconductor element stacking structure according to the first embodiment of the present invention.

FIG. 18 is a side view of the semiconductor element stacking structure according to the first embodiment of the present invention. In the semiconductor element stacking structure shown in FIG. 18, four semiconductor elements 4 are stacked, and each of the semiconductor elements 4 has chip select electrodes CS1, CS2, CS3 and CS4.

Figure 19:
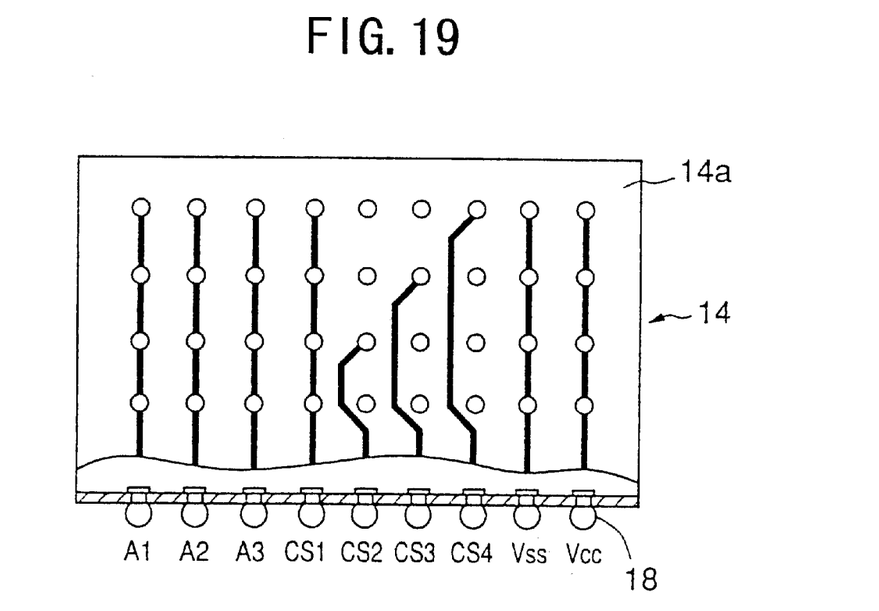
FIG. 19 is a illustration of an interposer provided to the semiconductor element stacking structure shown in FIG. 18.

By providing the interposer 14 having wirings as shown in FIG. 19 to the semiconductor element stacking structure having a side surface as shown in FIG. 18, the chip select electrodes CS1, CS2, CS3 and CS4 of each of the semiconductor elements 4 can be individually connected to the respective solder balls 18 serving as external connection terminals. It should be noted that the wirings and the pads shown in FIG. 19 are perspectively shown and actually provided on the opposite side of the side portion 14a of the interposer 14. According to the above-mentioned interposer 14, the chip select signals can be individually supplied to each of the semiconductor elements 4 via the solder balls 18.

The present invention is not limited to the specifically disclosed embodiments, and variations and modifications may be made without departing from the scope of the present invention.

The present application is based on Japanese priority application No. 2000-234863, filed on Aug. 2, 2000, the entire contents of which are hereby incorporated by reference.

What is claimed is:

1. A semiconductor element stacking structure comprising:
   a plurality of semiconductor elements arranged in a stacked state, each of the semiconductor elements having a circuit forming surface on which electrodes are formed;
   a resin layer formed on the circuit forming surface of each of the semiconductor elements, the resin layer having an outer configuration the same as that of each of the semiconductor elements; and
   a plurality of bonding wires embedded in the resin layer, one end of each of the bonding wires being connected to respective one of said electrodes and the other end of each of the bonding wires being exposed on a side surface of the resin layer.

2. The semiconductor element stacking structure as claimed in claim 1, wherein the exposed ends of said bonding wires are aligned along a line separated from the circuit forming surface of corresponding one of said semiconductor elements by a predetermined distance.

3. The semiconductor element stacking structure as claimed in claim 1, wherein the exposed ends of said bonding wires are aligned along a plurality of lines separated from the circuit forming surface of corresponding one of said semiconductor elements by different distances, respectively.

4. The semiconductor element stacking structure as claimed in claim 3, wherein the exposed ends of said bonding wires are aligned along a first line and a second line, said first line being separated from the circuit forming surface of the corresponding one of said semiconductor elements by a first predetermined distance, said second line being separated from the circuit forming surface of the corresponding one of said semiconductor elements by a second predetermined distance, the exposed ends of said bonding wires being alternately arranged so that one of the exposed ends is positioned on said first line and another exposed ends adjacent to the one of the exposed ends is positioned said second line.

5. The semiconductor element stacking structure as claimed in claim 1, wherein a protruding electrode is provided on each of the exposed ends of said bonding wires.

6. The semiconductor element stacking structure as claimed in claim 5, wherein said protruding electrode is a stud bump.

7. A semiconductor element stacking structure comprising:
   a plurality of semiconductor elements arranged in a stacked state, each of the semiconductor elements having a circuit forming surface on which electrodes are formed;

a resin layer formed on the circuit forming surface of each of the semiconductor elements, the resin layer having an outer configuration the same as that of each of the semiconductor elements;

a plurality of bonding wires embedded in the resin layer, one end of each of the bonding wires being connected to respective one of said electrodes and the other end of each of the bonding wires being exposed on a side surface of the resin layer and being provided with a protruding electrode; and protruding electrodes provided on a surface of a resin layer covering the circuit forming surface of a lowermost semiconductor element from among the stacked semiconductor elements, said protruding electrodes being connected to electrodes of the semiconductor elements.

8. The semiconductor element stacking structure as claimed in claim 7, wherein said protruding electrodes are stud bumps.

9. The semiconductor element stacking structure as claimed in claim 7, wherein the protruding electrodes aligned along a line extending in a stacking direction from among the protruding electrodes provided on the exposed ends of said bonding wires are connected by bonding wires to each other.

10. The semiconductor element stacking structure as claimed in claim 7, wherein a wiring board is mounted on a side surface on which said protruding electrodes provided to the exposed ends are formed so that said protruding electrodes are connected to each other by wirings of said wiring board.

11. The semiconductor element stacking structure as claimed in claim 7, wherein a semiconductor element is mounted on a side surface on which said protruding electrodes provided to the exposed ends are formed.

12. A semiconductor element stacking structure comprising:

a plurality of semiconductor elements arranged in a stacked state, each of the semiconductor elements having a circuit forming surface on which electrodes are formed;

a resin layer extending over the circuit forming surface of each of the semiconductor elements, the resin layer having an outer configuration the same as that of each of the semiconductor elements;

a redistribution layer provided between the circuit forming surface of each of said semiconductor elements and said resin layer; and a plurality of bonding wires embedded in the resin layer, one end of each of the bonding wires being connected to respective one of said electrodes and the other end of each of the bonding wires being exposed on a side surface of the resin layer.

13. A semiconductor device having a plurality of stacked semiconductor elements, comprising:

a semiconductor element stacking structure comprising:

a plurality of semiconductor elements arranged in a stacked state, each of the semiconductor elements having a circuit forming surface on which electrodes are formed;

a resin layer formed on the circuit forming surface of each of the semiconductor elements, the resin layer having an outer configuration the same as that of each of the semiconductor elements;

a plurality of bonding wires embedded in the resin layer, one end of the each of the bonding wires being connected to respective one of said electrodes and the other end of each of the bonding wires being exposed on a side surface of the resin layer; and a plurality of protruding electrodes provided on the respective exposed ends of said bonding wires;

a wiring board provided over a bottom surface and side surfaces of said semiconductor element stacking structure;

protruding terminals connected to the respective protruding electrodes provided on said semiconductor element stacking structure through said wiring board, the protruding terminals being provided on a side of said wiring board opposite to said semiconductor element stacking structure.

14. The semiconductor device as claimed in claim 13, wherein said wiring board comprises a bottom part covering a bottom surface of said semiconductor element stacking structure and a side part covering a side surface on which said protruding electrodes are formed, and said protruding terminals are provided on said bottom part of said wiring board.

15. The semiconductor device as claimed claim 13, wherein said wiring board comprises a bottom part covering a bottom surface of said semiconductor element stacking structure and a side part covering a side surface on which said protruding electrodes are formed, and said protruding terminals are provided on said side part of said wiring board.

16. A semiconductor device having a plurality of stacked semiconductor elements, comprising:

a semiconductor element stacking structure comprising:

a plurality of semiconductor elements arranged in a stacked state, each of the semiconductor elements having a circuit forming surface on which electrodes are formed;

a resin layer formed on the circuit forming surface of each of the semiconductor elements, the resin layer having an outer configuration the same as that of each of the semiconductor elements;

a plurality of bonding wires embedded in the resin layer, one end of the each of the bonding wires being connected to respective one of said electrodes and the other end of each of the bonding wires being exposed on a side surface of the resin layer; and a plurality of protruding electrodes provided on the respective exposed ends of said bonding wires, wherein protruding electrodes are provided on a surface of a resin layer covering the circuit forming surface of a lowermost semiconductor element from among the stacked semiconductor elements, said protruding electrodes being connected to electrodes of the semiconductor elements; and the protruding electrodes aligned along a line extending in a stacking direction from among the protruding electrodes provided on the exposed ends of said bonding wires are connected by bonding wires to each other;

a wiring board provided opposite to a surface of a resin layer covering the circuit forming surface of a lowermost semiconductor element;

a seal resin encapsulating said semiconductor element stacking structure on said wiring board; and protruding terminals connected to the respective protruding electrodes provided on the surface of said resin layer covering the circuit forming surface of the lowermost semiconductor element in said semiconductor element stacking structure.

\* \* \* \* \*